(12) United States Patent
Barrow

(10) Patent No.: US 7,916,539 B2
(45) Date of Patent: Mar. 29, 2011

(54) DIFFERENTIAL, LEVEL-SHIFTED EEPROM STRUCTURES

(75) Inventor: Jeffrey G. Barrow, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 178 days.

(21) Appl. No.: 12/321,700

(22) Filed: Jan. 23, 2009

(65) Prior Publication Data

US 2010/0188902 A1 Jul. 29, 2010

(51) Int. Cl.
*G11C 16/04* (2006.01)
(52) U.S. Cl. ......... 365/185.07; 365/185.21; 365/185.18; 365/185.27; 365/189.11
(58) Field of Classification Search ............. 365/189.15, 365/185.21, 185.07, 185.18, 185.27, 189.11
See application file for complete search history.

(56) References Cited

U.S. PATENT DOCUMENTS

| | | | |
|---|---|---|---|
| 5,412,238 A | 5/1995 | Chang | 257/321 |
| 5,646,885 A * | 7/1997 | Matsuo et al. | 365/185.05 |
| 5,835,409 A | 11/1998 | Lambertson | 365/185.15 |
| 5,841,700 A | 11/1998 | Chang | 365/185.18 |
| 5,889,788 A | 3/1999 | Pressly et al. | 371/22.31 |
| 5,930,631 A | 7/1999 | Wang et al. | 438/286 |
| 6,334,190 B1 | 12/2001 | Silverbrook et al. | 713/500 |
| 6,507,067 B1 | 1/2003 | Fratin et al. | 257/315 |
| 6,738,308 B2 | 5/2004 | Charlier et al. | 365/233 |
| 7,194,629 B2 | 3/2007 | Silverbrook | 713/171 |
| 7,201,319 B2 | 4/2007 | Silverbrook et al. | 235/454 |
| 7,602,640 B2 * | 10/2009 | Schatzberger | 365/185.07 |
| 2007/0064494 A1 * | 3/2007 | Morton et al. | 365/185.28 |

* cited by examiner

*Primary Examiner* — Hoai V Ho
*Assistant Examiner* — Kretelia Graham
(74) *Attorney, Agent, or Firm* — Koppel, Patrick, Heybl & Dawson

(57) ABSTRACT

Memory embodiments are provided to operate in memory systems which are configured to have a system ground and a system substrate that are biased at different voltages. At least one of these embodiments includes a memory cell and write and read circuits in which the memory cell is coupled to the system substrate and the write and read circuits are coupled to the system ground. The memory cell preferably has a cross-coupled pair of transistors which can be set in first and second states. The write circuit is arranged and level shifted to drive the cross-coupled pair into either selected one of the states and the read circuit is arranged and level shifted to provide a data signal indicative of the selected state.

19 Claims, 3 Drawing Sheets

DIFFERENTIAL, LEVEL-SHIFTED EEPROM STRUCTURES

BACKGROUND OF THE INVENTION

1. Field of the Invention

The present invention relates generally to electrically erasable, programmable read-only memory structures.

2. Description of the Related Art

Electrically erasable programmable read-only memory (EEPROM) is a non-volatile memory structure often used in electronic systems for storage of small amounts of data (e.g., calibration tables and device parameters) that must be saved when system power is removed to therefore be accessible when power is restored. A exemplary EEPROM memory cell includes a storage transistor and an associated second transistor which is used to program the storage transistor. The storage transistor is generally a metal-oxide-semiconductor (MOS) transistor in which a floating gate is positioned between the control gate and the semiconductor channel. With no charge programmed on the floating gate, the transistor is in an off state in which current is not conducted. When a charge is inserted into the floating gate, the transistor is biased into a stable on state in which current is conducted.

If conventional EEPROM's are used in integrated circuits in which a substrate voltage level differs from the circuit ground, they must be isolated from the substrate to insure the reliability of their stored data. An exemplary isolation structure is formed by surrounding the EEPROM cell with a semiconductor material of a type opposite that of the substrate. A semiconductor junction is thus established about the cell and when this junction is reverse biased it provides considerable isolation. A different isolation structure is formed by etching a trench in the substrate and filling the trench with a dielectric (e.g., silicon dioxide).

Such isolation structures, however, are generally too expensive to be used in low cost CMOS integrated circuits that are intended for use in markets in which cost is a controlling parameter (e.g., consumer markets).

BRIEF SUMMARY OF THE INVENTION

The present disclosure is generally directed to electrically erasable, programmable read-only memory embodiments. The drawings and the following description provide an enabling disclosure and the appended claims particularly point out and distinctly claim disclosed subject matter and equivalents thereof.

DETAILED DESCRIPTION OF THE INVENTION

FIGS. 1-4 illustrate a memory embodiment to operate in memory systems that are configured to have a system ground and a system substrate that are biased at different voltages. At least one of these embodiments includes a memory cell and write and read circuits in which the memory cell is coupled to the system substrate and the write and read circuits are coupled to the system ground.

The memory cell preferably has a cross-coupled pair of transistors which can be set in selectable first and second states. The write circuit is arranged and level shifted to drive the cross-coupled pair into either selected one of the states and the read circuit is arranged and level shifted to provide a data signal indicative of the selected state.

Figure 1:
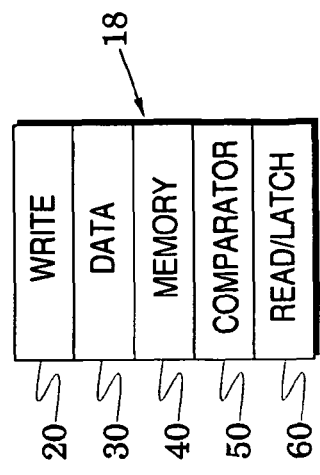
FIG. 1 is a diagram that illustrates portions of a memory cell embodiment.

In particular, FIG. 1 is a diagram which shows that a memory cell embodiment 18 comprises write 20, data 30, memory 40, comparator 50 and read/latch 60 portions. Embodiments of the write, data and memory cell portions are illustrated in detail in FIG. 2 and embodiments of the comparator and read/latch portions are illustrated in detail in FIG. 3.

Figure 2:
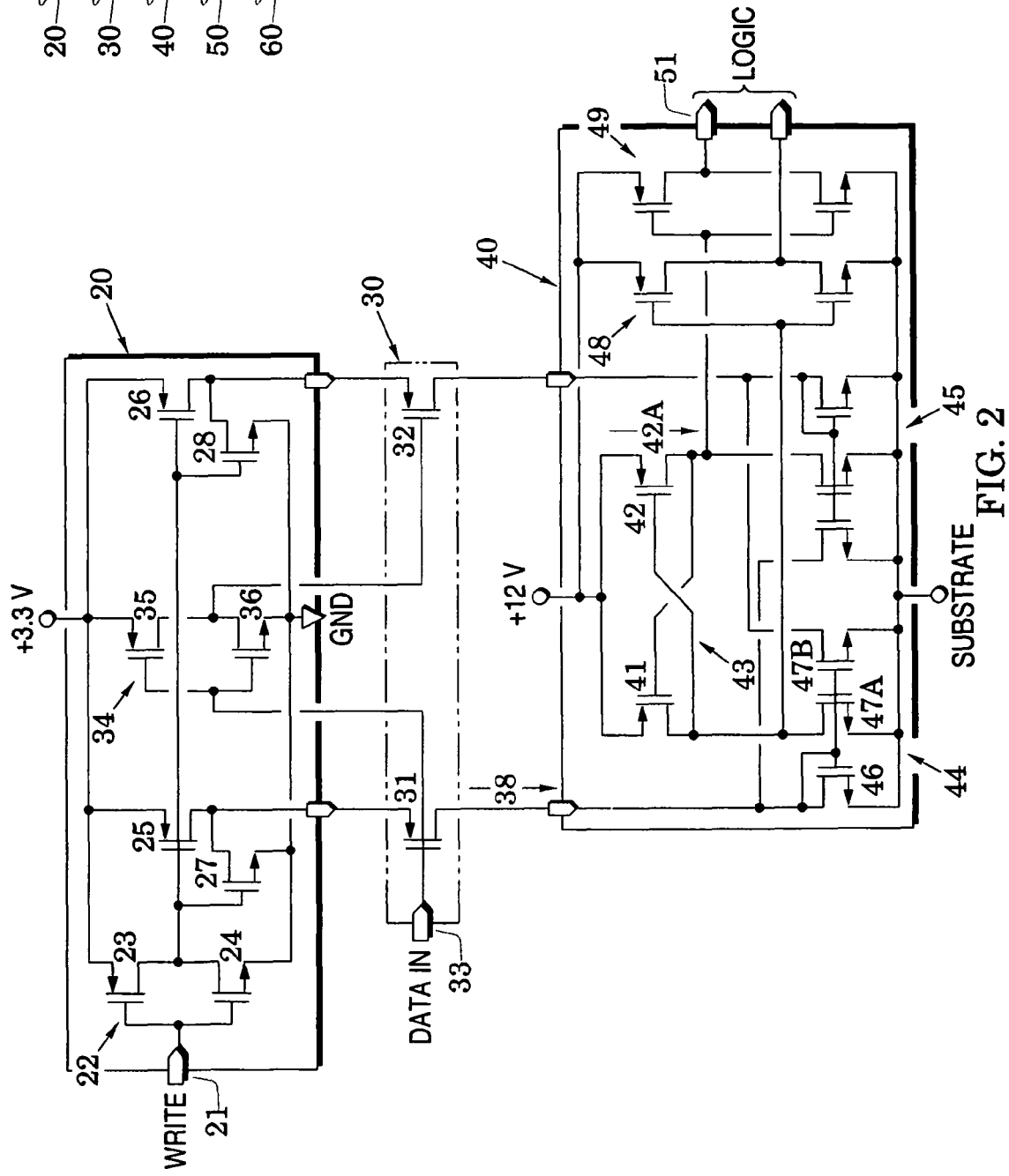
FIG. 2 is a schematic of embodiments of the write, data and memory portions of the memory cell of FIG. 1.

Directing attention initially to FIG. 2, it is seen that the write portion 20 has an inverter 22 formed of gate and drain coupled transistors 23 and 24. The inverter is coupled to respond to a write command at an input port 21 and the inverter's output is coupled to drive first and second write transistors 25 and 26 that are source coupled to a supply voltage (shown as an exemplary +3.3V supply). The inverter 22 is also coupled to drive shorting transistors 27 and 28 that are respectively coupled between ground and the drains of the first and second write transistors.

In operation of the write portion 20, a write command at the input port 21 is inverted by the inverter 22 so that the first and second transistors 25 and 26 are biased to each conduct a current from the write portion's supply voltage. In this write mode, the shorting transistors 27 and 28 are turned off. When the signal at the input port 21 is not in the write state (i.e., it is in a low state), the output of the inverter 22 turns the first and second write transistors off and turns on the shorting transistors 27 and 28. In this state, the drains of the first and second write transistors 25 and 26 are substantially shorted to a circuit ground (shown as a GND terminal) of the write portion 20. This insures that the first and second write transistors do not conduct currents in this state.

The data portion 30 of FIG. 2 includes first and second data transistors 31 and 32 wherein the gate of the first data transistor is coupled to a data port 33 and the transistors are separated by an inverter 34 formed of gate and source coupled transistors 35 and 36. Because the inverter 34 is coupled between ground and the supply voltage of the write portion 20, it is shown in that portion. The inverter's function is to simply cause the first and second data transistors 31 and 32 to respond oppositely to a data command at the data port 33.

In operation of the data portion 30, a high data signal at the data port 33 biases off the first data transistor 31 and biases on the second data transistor 32 (because of the signal inversion of the inverter 34). Conversely, a low data signal biases on the first data transistor 31 and biases off the second data transistor 32.

In an exemplary operational sequence, the data signal at the data port 33 would be placed in a selected one of its two states and, subsequently, the write signal at the write port 21 would transition to a high state in order to inject a current into a desired one of first and second current mirrors 44 and 45 in the memory portion 40 of FIG. 2. For example, FIG. 2 shows a current 38 flowing between the first data transistor 31 and the first current mirror 44. The current 38 is generated because a low data signal state has biased on the first data transistor 31 and biased off the second data transistor 32 (because of signal inversion through the inverter 34). The write signal state has subsequently switched to bias on the first and second write transistors 25 and 26.

Accordingly, the current 38 is conducted to the first current mirror 44 through the first write transistor 25 and the first data transistor 31. In contrast, a current would have been conducted to the second current mirror 45 if a high data signal had biased on the second data transistor 32. When the write signal at the write port 21 drops low, no currents are generated in the first and second current mirrors 44 and 45 because the first and second write transistors 25 and 26 are biased off. Therefore, in this write state, the data at the data port 33 is ignored.

The first and second current mirrors 44 and 45 have been introduced above and attention is now directed to the remainder of the memory portion 40 which comprises a cross-coupled pair 43 of first and second memory transistors 41 and 42 that respectively drive inverters 48 and 49 (formed similarly to the inverter 22 of the write portion 20) whose outputs are coupled to a memory port 51. In the cross-coupled pair 43, the gate of each of its transistors is coupled to the drain of the other transistor of the pair.

The first current mirror 44 comprises a diode-coupled transistor 46 that is coupled to receive a current from the first data transistor 31. First and second current transistors 47A and 47B are gate coupled to the diode-coupled transistor 46. The first current transistor 47A is drain coupled to the first memory transistor 41 and the second current transistor 47B is drain coupled to the second data transistor 32 of the data portion 30. The second current mirror 45 is similarly formed with its current transistors drain coupled to the second memory transistor 42 and to the first data transistor 31.

The cross-coupled pair 43 and the inverters 48 and 49 are coupled to a second supply voltage (shown as an exemplary +12V supply) and the current mirrors 44 and 45 are coupled above the voltage of a substrate.

In an exemplary operation of the memory 40, the current 38 from the first data transistor activates the diode-coupled transistor 46 so that the first current transistor 47A is biased on and pulls the gate of the second memory transistor 42 low. The second memory transistor 42 thus conducts a current 42A that drives its drain high. In response, the inverter 49 provides a low signal at the upper terminal of the logic port 51 and the first memory transistor 41 is biased off so that the inverter 48 provides a corresponding high signal at the lower terminal of the logic port. The second current transistor 47B of the current mirror 44 is also turned on which insures that the drain of the second data transistor 32 is low and that the second current mirror 45 is off.

It is noted that one of two states of the cross-coupled pair 43 is set by the action described above. When a current is conducted through the second data transistor 32, the cross-coupled pair is set in its other state which drives the inverter 49 to provide a high signal at the upper terminal of the logic port 51 and drives the inverter 48 to provide a low signal at the lower terminal of the logic port.

Figure 3:
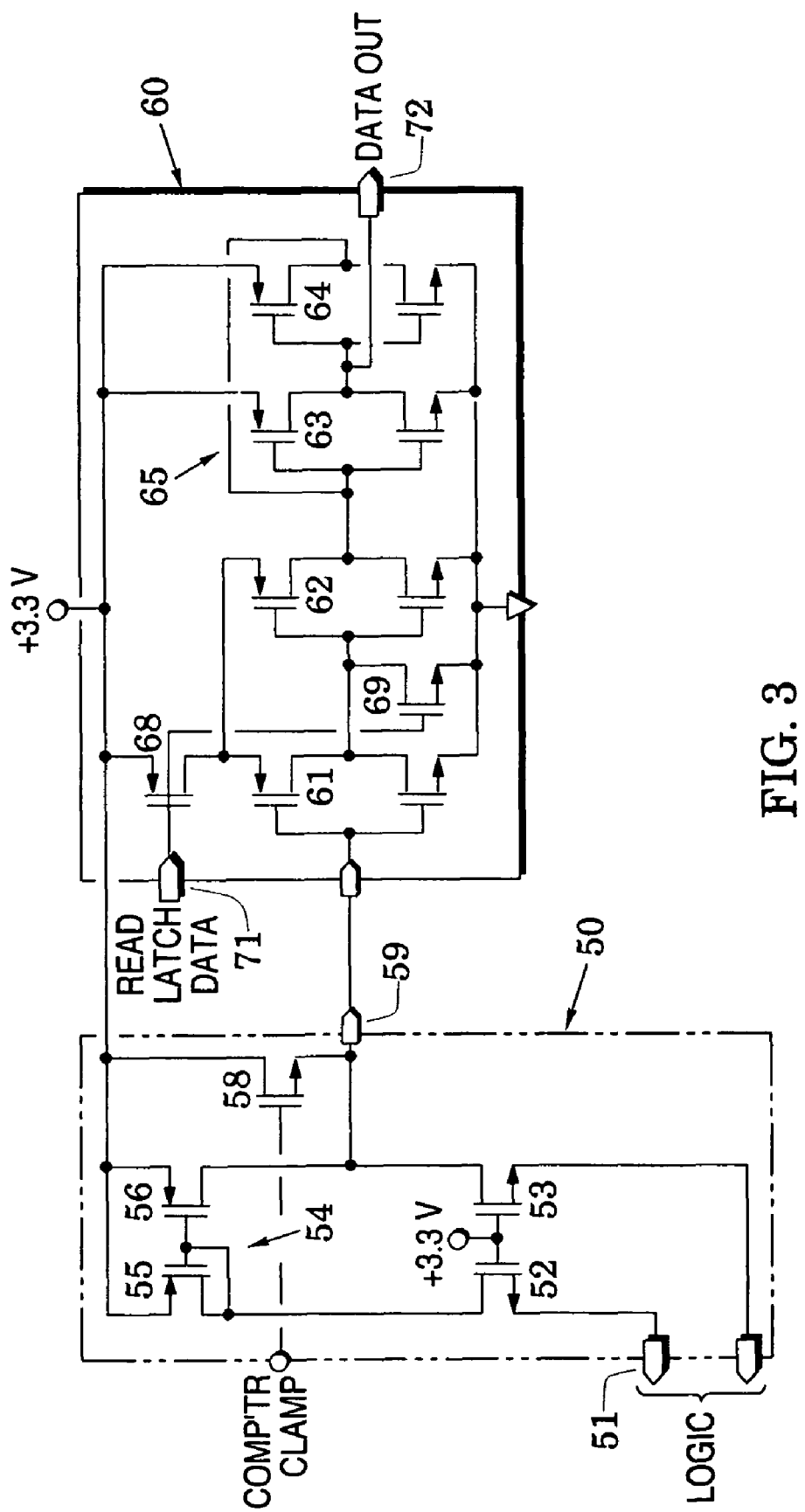
FIG. 3 is a schematic of embodiments of the comparator and read/latch portions of the memory cell of FIG. 1.

The logic port 51 is duplicated in the comparator 50 of FIG. 3 which includes a current mirror 54 and a pair of level-shifting transistors 52 and 53 that are inserted between the current mirror 54 and the logic port 51. The current mirror has a diode-coupled transistor 55 drain coupled to the transistor 52 and a current transistor 56 gate coupled to the diode-coupled transistor 55 and drain coupled to the transistor 53. The comparator portion 50 also includes a comparator clamp transistor 58 which clamps the comparator's output port high in response to a clamp signal at the gate of the clamp transistor. The current mirror 54 and the clamp transistor 58 are biased by the same supply voltage (shown as an exemplary +3.3V supply) as that of the write portion 20 of FIG. 2. The gates of the level-shifting transistors 52 and 53 are also biased by this supply voltage.

In operation of the comparator portion 50, a low signal at the upper terminal of the logic port 51 pulls current through the level-shifting transistor 52. At the same time, a high signal at the lower terminal of the logic port insures that current does not flow through the level-shifting transistor 53. Accordingly, a high signal occurs at the comparator output port 59. Opposite signals at the logic port 51 will impose a low signal at the comparator output port 59. The comparator 50 thus level shifts the signals at the output port 51 of the memory portion 40 and provides a signal at the comparator output port 59 that indicates the state of the memory portion.

The read/latch portion 60 of FIG. 3 has four inverters 61, 62, 63 and 64 serially arranged with a data out signal between the third and fourth inverters provided at a memory cell output port 72. The output of the fourth inverter 64 is coupled to the input of the third inverter so that these two inverters act as a latch 65 in which an output signal is latched in one of two states and this state is held until an appropriate signal is provide to shift the latch 65 into its other state. The read/latch portion 60 also includes an enable transistor 68 that is coupled to drive the top rail of the inverters 61 and 62 and a disable transistor 69 that is coupled to drive the connection path between the inverters 61 and 62. The enable and disable transistors respond to a read/latch data signal at an input port 71.

In operation of the read/latch portion 60, a high state of the read/latch data signal turns off the disable transistor 69 and causes the enable transistor 68 to apply an operational voltage (e.g., 3.3 V) to the inverters 61 and 62. Accordingly, the state of the signal at the comparator output port 59 will duplicated at the output of the second inverter 62 and will be duplicated at the output of the fourth inverter 64. In the embodiment 60, the data output 72 is taken from the input of the fourth inverter so that the data out signal will be an inversion of the signal provided by the comparator 50. When the read/latch data signal at the port 71 moves to a low state, the inverters 61 and 62 no longer respond to signals at the comparator output port 59 but feedback around the third and fourth inverters 63 and 64 latches these inverters into their last condition.

Data is thus written into the memory 40 of FIG. 2 by setting the data signal at the data port 33 of the data portion 30 high or low and subsequently applying the write signal at the write port 21 of the write portion 20. The resultant current through one of the data transistors 31 and 32 will initiate a current in one of the current mirrors 44 and 45 of the memory 40. This current sets the cross-coupled pair 43 in one of two stable states.

Data is then written out of the read/latch 60 of FIG. 3 by applying a read/latch signal to the read/latch port 71. The comparator 50 provides a signal at the comparator output port 59 which is set by the present condition at the logic port 51 of the memory portion 40. The inverters 61, 62 and 63 cause the inverse of this signal to appear at the data output port 72 and this signal is latched by the feedback about the third and fourth inverters 63 and 64.

Figure 4:
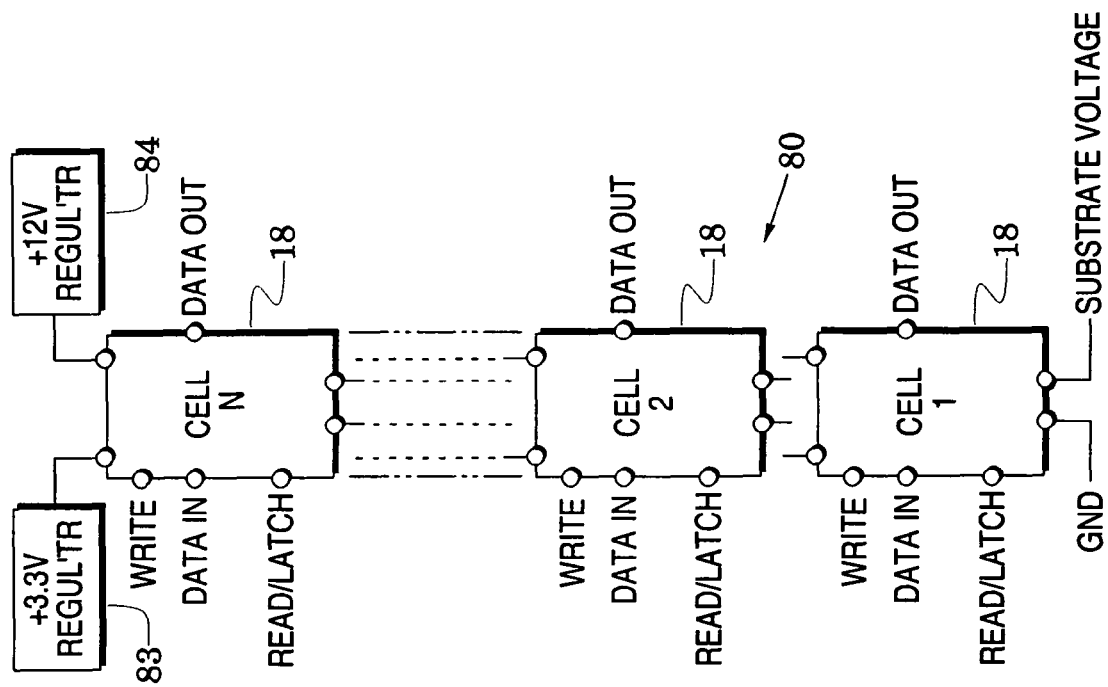
FIG. 4 is a block diagram of a memory system in which a plurality of the memory cells of FIG. 1 are biased between regulator voltages, circuit ground and a substrate voltage.

FIG. 4 illustrates a memory system 80 which includes N of the memory cells 18 of FIGS. 1-3. The memory in each of the cells can be programmed with data in and write commands and read out at a data out port with use of a read/latch signal. The substrate of each of the cells is biased at a substrate voltage which may be substantially lower than a circuit ground level (shown as GND). A voltage regulator 83 is used to provide a voltage (e.g., 3.3 V) for the write, comparator and read/latch portions 20, 50 and 60 shown in FIGS. 2 and 3. A second voltage regulator 84 is used to provide a voltage (e.g., +12 V) for the memory portion 40 shown in FIG. 2. When data is not being written into the memory cells 18 nor being read out, the structure of the cells permits the regulators 83 and 84 to be turned off so that the system 80 adds very little to the power requirement of an integrated circuit of which it is a part. In a system embodiment, the write commands can be applied as a common write command and the read/latch commands can be applied as a common read/latch command.

The memory cell 18 of FIGS. 1 and 4 is particularly useful in integrated circuit structures in which the circuit ground and the integrated circuit substrate are at different voltage levels. In thin film transistor, liquid crystal display (TFT-LCD) panels, for example, essential data for trimming panel parameters (e.g., reference voltages, reference currents, and transistor threshold voltages) is generally stored in non-volatile memory. In these panels, however, the substrate may be set to a negative voltage (e.g., −25 volts) which is far below the circuit ground. In addition, there may be a substantial level of noise on the substrate. These conditions endanger the fidelity of the memory signals when conventional EEPROM cells are used.

The EEPROM cells can be electrically isolated from the substrate by installing them in tubs or within trenches that are isolated from the substrate by reverse-biased semiconductor junctions. These structures, however, consume valuable semiconductor area and are not well suited for use in low cost complementary metal-oxide-semiconductor (CMOS) fabrication processes. In addition, there remains a risk that substrate noise will alter the stored data.

These concerns are successfully addressed in the memory system 80 of FIG. 4. It is noted, for example, that the cross-coupled pair 43 and associated current mirrors 44 and 45 of the memory portion 40 of FIG. 2 are safely arranged between +12V and the substrate voltage. Data is then written into the cross-coupled pair with a current (e.g., the current 38) that is generated in the write portion 20 which operates between +3.3 volts and the circuit ground. This data current is coupled to activate the current mirrors 44 and 45 by the level-shifting action of the data transistors 31 and 32. After one of the current mirrors 44 and 45 has set the desired state of the differential pair 43, the inverters 48 and 49 provide isolation between the pair 43 and the comparator portion 50 of FIG. 3.

Just as the data transistors 31 and 32 provide level shifting between the data and memory portions 30 and 40, the transistors 52 and 53 of the comparator portion 50 provide level shifting between the memory and read/latch portions 40 and 60. To further enhance logic fidelity, the comparator portion 50 is configured so that the read function is performed differentially just as is the write function in the memory portion 40. The output data at the output port 72 of the read/latch portion 60 of FIG. 3 is latched in the latch 65 so that it will not be altered by inadvertent signals (e.g., noise).

It is noted that various parameters (e.g., temperature, noise, age, and assembly) may alter the level of memory parameters (e.g., amplitudes of currents 38 and 42A in FIG. 2). However, the differential and level-shifting input and output structures of FIGS. 2 and 3 are not affected by these alterations so that the writing, storing, and reading operations continue to be reliable.

The memory cell embodiment 18 of FIGS. 1-3 have been illustrated with exemplary metal-oxide-semiconductor transistors but other useful cell embodiments can be formed with other transistors (e.g., bipolar junction transistors) that have current terminals which conduct currents in response to commands at control terminals.

The embodiments of the invention described herein are exemplary and numerous modifications, variations and rearrangements can be readily envisioned to achieve substantially equivalent results, all of which are intended to be embraced within the spirit and scope of the appended claims.

I claim:

1. A memory to operate in a memory system having a system ground and a system substrate biased at different voltages, comprising:
   a memory cell coupled to said substrate having a cross-coupled pair of transistors which can be set in first and second states;
   a write circuit coupled to said ground and arranged to drive said cross-coupled pair into either selected one of said states; and
   a read circuit coupled to said ground and arranged and level shifted to provide a data signal indicative of said selected state;
   wherein said write circuit is arranged to generate first and second write currents and wherein said memory cell includes first and second current minors arranged to drive said cross-coupled pair into said selected state in selective response to said first and second write currents.

2. The memory of claim 1, wherein said write circuit includes:
   first and second write transistors coupled to initiate said first and second write currents in response to a write command; and
   first and second data transistors positioned between said first and second write transistors and said memory cell to pass a selected one of said first and second write currents in response to data command.

3. The memory of claim 1, wherein said memory cell includes first and second inverters arranged to indicate respective ones of said states.

4. The memory of claim 1, wherein said read circuit includes:
   a comparator coupled to said memory cell to provide a comparator signal indicative of said selected state; and
   at least one read inverter arranged to provide said data signal in response to said comparator signal.

5. The memory of claim 4, wherein said comparator includes:
   a current mirror; and
   first and second comparator transistors coupled between said current minor and said cross-coupled pair to level shift and indicate said selected state to said read inverter.

6. The memory of claim 4, wherein said read circuit includes at least two inverters arranged to provide and latch said data signal in response to said comparator signal.

7. A memory to operate in a memory system having a system ground and a substrate biased at different voltages, comprising:
   a memory circuit coupled to said substrate and having a cross-coupled pair of transistors and first and second current minors arranged to alter the state of said cross-coupled pair;
   a write circuit coupled to said system ground and arranged to drive either selected one of said first and second current minors to set a state indicated by a data signal; and
   a read circuit coupled to said system ground and arranged to read out the state of said cross-coupled pair.

8. The memory of claim 7, wherein said write circuit includes:
   first and second write transistors responsive to a write command; and
   first and second data transistors arranged to couple said first write transistor to said first current mirror in response to a first level of said data signal and to couple said second write transistor to said second current mirror in response to a second level of said data signal.

9. The memory of claim 8, further including a data inverter coupled between said first and second data transistors.

10. The memory of claim 7, wherein:
said memory circuit includes first and second memory inverters arranged to drive said read circuit; and
said first current mirror has a first current transistor coupled to said first memory inverter and a first transistor of said cross-coupled pair and has a second current transistor coupled to said second inverter and a second transistor of said cross-coupled pair.

11. The memory of claim 7, wherein said read circuit includes at least one read inverter arranged to provide a data signal indicative of said state and further including a comparator inserted to drive said read inverter in response to said state.

12. The memory of claim 11, wherein said comparator includes:
a comparator current mirror arranged to provide a first current and minor a second current; and
first and second level-shifting transistors inserted between said current minor and said cross-coupled pair wherein one of said level-shifting transistors is coupled to drive said read inverter.

13. The memory of claim 11, wherein said read circuit includes at least two read inverters and a feedback path to latch said read inverters.

14. A memory to operate in response to write, data, and read commands and in response to first, second, ground and substrate voltages, comprising:
first and second write transistors coupled to receive said first voltage and arranged to provide first and second write currents in response to said write command;
first and second data transistors arranged to pass one of said first and second write currents selected by said data command;
a cross-coupled pair of memory transistors wherein said pair has first and second states and is coupled to receive said second voltage and said substrate voltage and is arranged to be set into either selected state of said first and second states by a corresponding one of said first and second write currents;
a comparator coupled to receive said first voltage and configured to provide a comparator signal indicative of said selected state; and
first and second read inverters coupled to receive said first voltage and said ground voltage and arranged to provide, in response to said read command and said comparator signal, a data signal indicative of said selected state.

15. The memory of claim 14, further including an inverter coupled between said first and second data transistors.

16. The memory of claim 14, further including first and second current mirrors each arranged to provide a current to a respective one of said first and second memory transistors in response to a respective one of said first and second write currents.

17. The memory of claim 14, further including first and second memory inverters each coupled to a corresponding one of said first and second memory transistors to indicate a corresponding one of said first and second states.

18. The memory of claim 17, wherein said comparator includes:
a current mirror; and
first and second level-shifting transistors respectively coupled between said current minor and said first and second memory inverters to thereby provide said comparator signal.

19. The memory of claim 14, further including:
third and fourth read inverters inserted to drive said first and second read inverters in response to said comparator signal; and
a read transistor arranged to activate said third and fourth read inverters in response to said read command.

* * * * *